United States Patent [19]
Zaleski

[11] 3,927,380
[45] Dec. 16, 1975

[54] TRANSFORMER COUPLED TRANSISTOR AMPLIFIER

[75] Inventor: John F. Zaleski, Pleasantville, N.Y.

[73] Assignee: The Singer Company, Little Falls, N.J.

[22] Filed: Aug. 19, 1960

[21] Appl. No.: 50,804

[52] U.S. Cl. .................. 330/21; 325/185; 325/492; 330/16; 330/165; 343/5 R
[51] Int. Cl. .............................................. H03f 3/04
[58] Field of Search ........ 330/16, 165, 21; 307/88.5

[56] References Cited

UNITED STATES PATENTS 2,644,859 7/1953 Barton .................................. 330/21

*Primary Examiner*—Maynard R. Wilbur
*Assistant Examiner*—Richard E. Berger
*Attorney, Agent, or Firm*—T. W. Kennedy

EXEMPLARY CLAIM

A two stage cascaded transistor amplifier in which the stages are transformer coupled utilizing a transformer having an impedance ratio of the order of magnitude of 1/20 characterized by the fact that the low impedance winding of the transformer is connected to the output of the first stage and the high impedance winding of the transformer is connected to the input of the second stage.

5 Claims, 2 Drawing Figures

TRANSFORMER COUPLED TRANSISTOR AMPLIFIER

This invention relates to transistor amplifiers especially to transformer coupled transistor amplifiers suitable for amplifying low level signals.

Transistor amplifier circuits are in general similar to their vacuum tube counterparts but differ therefrom in some respects because of the inherent difference in characteristics between transistors and vacuum tubes. For example, the power supplies required are quite different. As another example, transistors connected in either a grounded base or a grounded emitter circuit are said to have a low input impedance and a high output impedance. Accordingly, when two transistor stages are transformer coupled, it is the usual practice to connect the high impedance winding of the transformer to the output of the first stage and the low impedance winding to the input of the second stage.

It has been found that transformer coupled amplifiers connected in accordance with the usual practice as mentioned above are not always satisfactory especially when used to amplify low level signals. In fact, some amplifiers constructed in accordance with this practice have had such low gain as to be totally inoperative for the purposes intended.

A general object of the present invention is to provide an improved transistor amplifier.

Another object is to provide a transistor amplifier suitable for amplifying low level signals.

Another object is to provide a transistor amplifier requiring but a small amount of operating power and suitable for amplifying low level signals.

Briefly stated, the invention comprises a transformer coupled transistor amplifier in which the low impedance winding of the interstage transformer is connected to the output of the first stage while the high impedance winding is connected to the input of the second stage.

Figure 1:
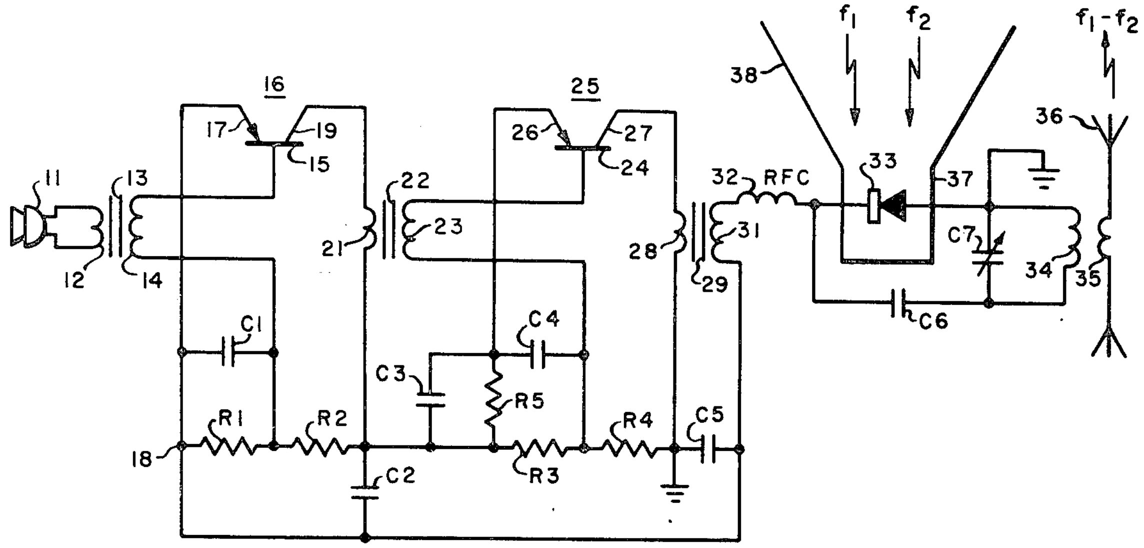
Figure 2:
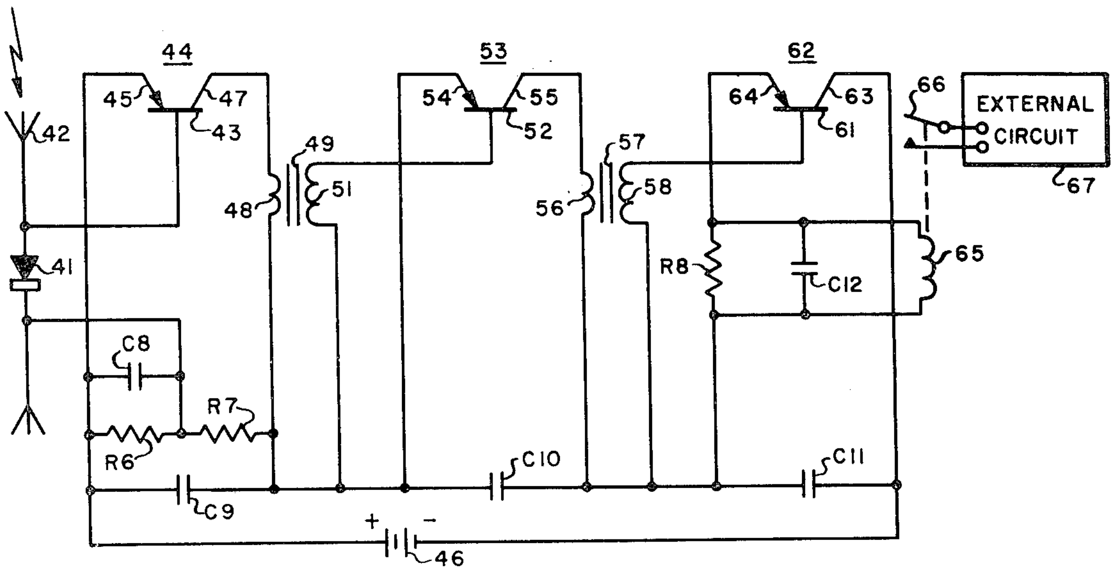

For a clearer understanding of the invention, reference may be made to the following detailed description and the accompanying drawing, in which:

FIG. 1 is a schematic diagram of a portion of a communication system including an amplifier in accordance with the invention; and FIG. 2 is a schematic diagram of a receiving station including an amplifier in accordance with the invention.

Referring first to FIG. 1, there is shown an amplifier in accordance with the invention incorporated into one station of a communication system which requires no local power supplies. A dynamic microphone 11, which generates a voltage in response to acoustic signals, is connected to the primary winding 12 of a small transformer 13, the secondary winding 14 of which has one terminal connected to the base 15 of a transistor 16 while the other terminal is connected through a large capacitance $C_1$ to the emitter 17 of the transistor 16. As will be more fully explained, direct current power for operating the amplifier appears between the junction 18 and ground, the junction 18 being positive with respect to ground, and the emitter 17 is connected directly to the junction 18. A voltage divider comprising serially connected resistors $R_1$, $R_2$, $R_3$ and $R_4$ is connected from the junction 18 to ground. The base 15 is returned, through the secondary winding 14, to the junction of resistors $R_1$ and $R_2$.

The amplified signal from the microphone 11 appears in the circuit of the collector 19 of the transistor 16, which is connected through the primary winding 21 of a transformer 22 to the junction of resistors $R_2$ and $R_3$, which junction is bypassed to the junction 18 by a large capacitor $C_2$. The secondary winding 23 of the transformer 22 has one terminal connected to the base 24 of a transistor 25 while the other terminal is connected to the junction of resistors $R_3$ and $R_4$, which junction is bypassed to the emitter 26 of the transistor 25 by a large capacitor $C_4$. The emitter 26 is connected through the parallel combination of a resistor $R_5$ and a large capacitor $C_3$ to the junction of resistors $R_2$ and $R_3$. The collector 27 of the transistor 25 is connected through the primary winding 28 of a transformer 29 to ground. The output of the amplifier appears in the secondary winding 31 one terminal of which is connected to the junction 18 and is bypassed to ground by a large capacitor $C_5$. The other terminal of the secondary winding 31 is connected through a radio frequency choke 32 to the cathode of a diode 33, the anode of which is grounded. The cathode of the diode 33 is also connected through a small capacitor $C_6$ to one terminal of a tank circuit comprising a variable capacitor $C_7$ and a coil 34 connected in parallel, the other terminal of the tank circuit being grounded. A coil 35 is coupled to the coil 34 and is connected to an antenna 36. The diode 33 is physically positioned within a waveguide, schematically shown at 37, to which is connected an antenna, shown schematically as comprising a horn 38.

The apparatus above described comprises one station of a communication system which requires no local source of power. In operation, radio frequency energy is transmitted from a remote station at two frequencies $f_1$ and $f_2$, such as 8830 mcps and 8800 mcps, to the diode 33, which is positioned in the waveguide 37 in a region of high field strength. A number of significant results follow. First, a portion of the radio frequency energy is rectified, causing a small direct current to flow from anode to cathode, through the choke 32 and the winding 31 to the junction 18 and thence through the voltage divider $R_1$, $R_2$, $R_3$ and $R_4$ to ground and back to the anode of the diode 33. Current also flows, of course, through the transistors 16 and 25, thereby making the amplifier operable. Second, the nonlinear characteristics of the diode 33 causes modulation of the impressed radio frequencies resulting in the production of many new frequencies of which the difference frequency, $f_1$–$f_2$ (30 mcps), is of principal interest. The tank circuit is resonant at this difference frequency and since it is connected across the diode 33, a comparatively large current flows in the tank. Finally, since the audio output of the amplifier is impressed across the diode 33, the difference frequency $f_1$–$f_2$ (30 mcps) is modulated in accordance with the signal impressed on the microphone 11 and the modulated signal appears in the tank circuit. The winding 35 picks up the modulated signal which is transmitted to the antenna 36 and radiated. The audio signal may be recovered at any convenient location with a conventional receiver.

The audio amplifier above described must amplify the low level signal from the microphone 11 and must do so with an extremely low power consumption since the only power available is that which can be derived from incident radio frequency energy. Transistors appear to be the logical choice for amplifying elements. The prior art teaches that transistors, when used in the usual grounded emitter configurations, have a low input impedance and a high output impedance and that suitable coupling networks must be provided to accommodate these impedance differences. For example, the book "Transistors in Radio and Television", by Milton S. Kiver, McGraw Hill, 1956, discusses this problem at pages 100, 101 and 102, stating that a typical input impedance may be on the order of 1,000 ohms while a typical output impedance may be on the order of 10,000 or 20,000 ohms. The text goes on to say > " . . . Another solution would be to insert a device (i.e. a step-down transformer) which will match the higher output impedance of one stage to the lower input impedance of the following stage."

A circuit illustrating the above solution is shown in FIG. 9 of the book which shows an interstage transformer having a primary to secondary impedance ratio of 20,000 ohms to 1,000 ohms.

As another example of the prior art, the "General Electric Transistor Manual", third edition, 1958, illustrates, on page 48, a typical circuit employing a transformer coupled audio amplifier. The interstage transformer, $T_1$, is specified as "20K Ω/600 Ω".

The above examples of prior art are typical of many others which could be cited, all to the same effect. However, when an amplifier as shown in FIG. 1 was constructed in accordance with these teachings, with the high impedance winding (large number of turns) of the interstage transformer 22 connected to the collector circuit of the transistor 16 and the low impedance winding (small number of turns) of the transformer 22 connected to the base circuit of the transistor 25, the result was an amplifier with such low gain as to be totally inoperative for the purpose intended. Applicant then departed from the prior art and connected the low impedance winding (small number of turns) of transformer 22 to the collector circuit of the transistor 16 and connected the high impedance winding (large number of turns) of the transformer 22 to the base circuit of the transistor 25. This circuit change made the difference between a device which was wholly inoperative for its intended purpose and a device which has operated highly satisfactorily during an extended period of testing. In FIG. 1, all of the transformers are connected as step-up transformers with the low impedance windings as primaries and the high impedance windings as secondaries. Windings 12, 21 and 28 are the low impedance windings while windings 14, 23 and 31 are the high impedance windings.

The reasons for the improved operation have not been fully determined but it is believed that transistors exhibit vastly different impedance characteristics when operated at extremely low signal and power levels than when operated at the more usual levels. Whatever the reason, applicant, by proceeding contrary to the teaching of the prior art, has produced a very satisfactory amplifier.

By way of example, the specifications of the components used in the amplifier of FIG. 1 are given below.

| | |
|---|---|
| Transistors 16 and 25: | General Transistor Co. Jamaica, L.I. N.Y. Model X-75 |
| Transformer 13 | Argonne Electronics Mfg. Corp. Model AR 149 |
| Transformer 22 | Argonne Model AR 100 |
| Transformer 29 | Argonne Model AR 162 |
| Resistor $R_1$ | 5,000 ohms |
| Resistor $R_2$ | 25,000 ohms |
| Resistor $R_3$ | 15,000 ohms |
| Resistor $R_4$ | 20,000 ohms |

-continued

| | |
|---|---|
| Resistor $R_5$ | 3,000 ohms |
| Capacitors $C_1$, $C_2$, $C_3$, $C_4$, $C_5$ | 10 microfarads |
| Diode 33 | 1N23E |

FIG. 2 shows another amplifier constructed in accordance with the invention. The amplifier is the principal part of a receiving station which receives a burst of modulated radio frequency energy and operates a relay in response thereto, the relay in turn controlling an external circuit. This amplifier also operates at a low level both as to signal input and power consumption. A single 1.34 volt battery is the sole source of power for all three transistors.

Examining FIG. 2 in more detail, there is shown a diode 41 connected to be subjected to the energy received by an antenna 42, which of course may be any of various kinds such as a dipole, a horn, a linear array, etc. The diode recovers any modulation present on the incoming radio frequency and applies it to the input of the amplifier. The anode of the diode 41 is connected directly to the base 43 of a transistor 44 while the cathode of the diode 41 is connected to one plate of a large capacitor $C_8$ the other plate of which is connected to the emitter 45 of the transistor 44. A single cell battery 46 supplies the power for the amplifier and is shunted by serially connected capacitors $C_9$, $C_{10}$ and $C_{11}$. The positive terminal of the battery 46 is connected to the emitter 45 which, as previously mentioned, is also connected to one plate of the capacitor $C_8$. The collector 47 of the transistor 44 is connected through the primary winding 48 of a transformer 49 to the junction of capacitors $C_9$ and $C_{10}$. Two resistors $R_6$ and $R_7$ are serially connected across the capacitor $C_9$ and their junction is connected to the cathode of the diode 41.

The secondary winding 51 of the transformer 49 has one terminal connected to the junction of the capacitors $C_9$ and $C_{10}$ and the other terminal connected to the base 52 of a transistor 53. The emitter 54 of the transistor 53 is also connected to the junction of the capacitors $C_9$ and $C_{10}$ while the collector 55 is connected through the primary winding 56 of a transformer 57 to the junction of the capacitors $C_{10}$ and $C_{11}$. The secondary winding 58 has one terminal connected to the junction of capacitors $C_{10}$ and $C_{11}$ while the other terminal is connected to the base 61 of a transistor 62. The collector 63 of the transistor 62 is connected directly to the negative terminal of the battery 46 while the emitter 64 is connected through a load resistor $R_8$ to the junction of capacitors $C_{10}$ and $C_{11}$. The useful output voltage of the amplifier is developed across the load resistor $R_8$ and this voltage is applied to a relay winding 65 which controls a normally open contact 66. The contact 66 in turn controls an external circuit 67 in any of various ways such as by operation of a step switch (not shown). The load resistor $R_8$ is shunted by a capacitor $C_{12}$.

As previously mentioned, the sole purpose of the amplifier of FIG. 2 is to raise the level of a received signal sufficiently to operate the direct current relay winding 65. Therefore, there is no need to preserve the form of the input wave and the transistors may be biased to amplify one half of each cycle more than the other half. The biasing circuits are therefore different from those illustrated in FIG. 1 and the application of a signal to the input causes a large increase in the direct current component flowing in the output circuit.

Upon the receipt by the antenna 42 of a modulated radio frequency signal, the diode 41 acts as a demodulator and applies the low frequency alternating current to the base-emitter circuit of the transistor 44. At the same time, a small direct current flows through the diode 41 which biases the diode to a favorable portion of its conversion efficiency curve and which also causes the voltage drop to be superimposed on the bias afforded by the resistors $R_6$ and $R_7$. An amplified version of the input appears in the circuit of the collector 47 and is transferred through the transformer 49 to the base-emitter circuit of the transistor 53. The further amplified signal appears in the circuit of the collector 55 and is transferred by the transformer 57 to the transistor 62. The transistor 62 is preferably connected in a grounded collector circuit as shown with the load resistor $R_8$ in the emitter circuit, sometimes called an emitter follower in analogy to the familiar cathode follower, although this sort of connection is not essential. Since the load current has a large direct current component, a separate rectifier is not necessary to operate the direct current relay 65, the large capacitor $C_{12}$ serving to smoothe the pulsating direct current sufficiently.

As in the case of FIG. 1, the transformers 49 and 57 are connected with the low impedance windings in the output circuits of the transistors and the high impedance windings in the input circuits of the following stages. The windings 48 and 56 are the low impedance windings while the windings 51 and 58 are the high impedance windings.

The following components have been found satisfactory for use in the amplifier of FIG. 2.

| | |
|---|---|
| Diode 41 | Type 1N23C |
| Transistors 44, 53 and 62 | General Transistor Co. Type X-75<br>Argonne Model AR-100 |
| Transformers 49 and 57 | Impedance ratio 1000/200,000 ohms. |
| Resistor $R_6$ | 10,000 ohms |
| Resistor $R_7$ | 25,000 ohms |
| Resistor $R_8$ | 3,000 ohms |
| Capacitors $C_8$, $C_9$, $C_{10}$, $C_{11}$, and $C_{12}$ | 10 microfarads |
| Relay 65 | 50 microwatt d.c. relay,<br>2300 ohm winding |
| Battery 46 | 1.34 volt mercury cell size D |

The circuit of FIG. 2, with the components given above, has been in experimental use for some time with very satisfactory results. During one test, the following observations were made. In the absence of an input signal, a static direct current of between 20 and 25 microamperes flowed in the relay winding 65. A radio frequency signal modulated at 11,000 cycles was applied to the antenna 42 with sufficient intensity to cause an alternating voltage of 0.0012 volts to appear across the diode 41. A direct current of 380 microamperes then flowed through the relay winding 65, causing the relay to operate and the contacts 66 to close. Next, the transformer 49 was disconnected and reconnected with the high impedance winding connected to the collector 47 and the low impedance winding connected to the base 52. In the absence of an input signal the static current through the relay 65 was the same as before, between 20 and 25 microamperes. Upon the application of an input signal as above, with an alternating voltage of 0.0012 volts appearing across the diode 41, no change in load current could be observed, the current through the relay winding remaining at its static value of between 20 and 25 microamperes. No relay action occurred, and the contacts 66 remained open.

From the foregoing it is apparent that applicant has made an important contribution to the art of constructing amplifiers requiring but small amounts of power yet capable of amplifying low level signals. While two specific embodiments of the invention have been described for illustrative purpose, many modifications will occur to those skilled in the art. It is therefore desired that the protection afforded by letters patent be limited only by the true scope of the appended claims.

What is claimed is:

1. A two stage cascaded transistor amplifier in which the stages are transformer coupled utilizing a transformer having an impedance ratio of the order of magnitude of 1/20 characterized by the fact that the low impedance winding of the transformer is connected to the output of the first stage and the high impedence winding of the transformer is connected to the input of the second stage.

2. An amplifier comprising, first and second transistor amplifier stages, an interstage transformer which has impedence ratio of the order of magnitude of 1/20 including first and second windings, said first winding having fewer turns than said second winding, means connecting said first winding to the output of said first stage, and means connecting said second winding to the input of said second stage.

3. An amplifier comprising, first and second transistor amplifier stages each connected in a grounded emitter configuration, an interstage transformer including first and second windings, the ratio of the turns of said first winding to the turns of said winding being of the order of magnitude of 1/20, means connecting said first winding to the output of said first stage, and means connecting said second winding to the input of said second stage.

4. An amplifier comprising, first and second transistors each having an emitter, a base, and a collector, means for coupling an input signal to the base and the emitter of said first transistor, means for coupling an output circuit to the collector and the emitter of said second transistor, a transformer having first and second windings, the ratio of the turns of said first winding to the turns of said winding being of the order of magnitude of 1/20, means for coupling said first winding to the collector-emitter circuit of said first transistor, means for coupling said transistor, and a source of undirectional electric energy coupled across the emitter of said first transistor and collector of said second transistor for biasing all of the electrodes of both of said transistors.

5. An amplifier comprising, first and second transistors each having emitter, base and collector electrodes, means for coupling an input signal to said base and said emitter electrodes of said first transistor, means for deriving an output signal from said collector and said emitter electrodes of said seoond transistor, a transformer having first and second windings, the ratio of the turns of said first winding to the turns of said winding being of the order of magnitude of 1/20, means for connecting said first winding to the connecting said second winding to the base emitter circuit of said second transistor, a source of undirectional electric energy, and means for biasing all of said electrodes from said source coupled across the emitter of said first transistor and collector of said second transistor.

* * * * *